US 12,095,489 B2

(12) United States Patent
Tsuda et al.

(10) Patent No.: US 12,095,489 B2
(45) Date of Patent: Sep. 17, 2024

(54) HIGH-FREQUENCY CIRCUIT AND COMMUNICATION DEVICE

(71) Applicant: Murata Manufacturing Co., Ltd., Kyoto (JP)

(72) Inventors: Motoji Tsuda, Kyoto (JP); Hayato Nakamura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 85 days.

(21) Appl. No.: 18/159,193

(22) Filed: Jan. 25, 2023

(65) Prior Publication Data

US 2023/0163796 A1 May 25, 2023

Related U.S. Application Data

(63) Continuation of application No. PCT/JP2021/032658, filed on Sep. 6, 2021.

(30) Foreign Application Priority Data

Sep. 25, 2020 (JP) ................................. 2020-161139

(51) Int. Cl.
*H04B 1/04* (2006.01)
*H03F 3/24* (2006.01)

(52) U.S. Cl.
CPC ............ *H04B 1/0475* (2013.01); *H03F 3/245* (2013.01); *H03F 2200/165* (2013.01); *H03F 2200/451* (2013.01); *H04B 2001/0425* (2013.01)

(58) Field of Classification Search
CPC .... H04B 1/0475; H04B 1/0057; H04B 1/006; H03F 1/565; H03F 3/195; H03F 3/245;
(Continued)

(56) References Cited

U.S. PATENT DOCUMENTS 9,660,687 B2 * 5/2017 Ellä ........................ H04B 1/006
2012/0133431 A1 5/2012 Kawakami et al.
(Continued)

FOREIGN PATENT DOCUMENTS

JP 2010-141673 A 6/2010
JP 2014-127959 A 7/2014
(Continued)

OTHER PUBLICATIONS

International Search Report for PCT/JP2021/032658 dated Dec. 7, 2021.

*Primary Examiner* — Dac V Ha
(74) *Attorney, Agent, or Firm* — Pearne & Gordon LLP

(57) ABSTRACT

A high-frequency circuit includes a power amplifier for a communication band A, and a power amplifier for a communication band B. Transmission in the communication band A, transmission in the communication band B, and reception in the communication band C can be simultaneously used. A frequency range of intermodulation distortion generated between a second harmonic wave of a transmission signal of the communication band A and a fundamental wave of a transmission signal of the communication band B, overlaps with at least part of a reception band of the communication band C. The power amplifier includes amplifying elements and an output trans including coils. One end of the coil is connected with an output of the amplifying element, the other end of the coil is connected with an output of the amplifying element, and one end of the coil is connected with an output terminal of the power amplifier.

20 Claims, 3 Drawing Sheets

(58) Field of Classification Search
CPC .............. H03F 3/72; H03F 2200/111; H03F 2200/165; H03F 2200/294; H03F 2200/451; H03F 2200/534; H03F 2200/537; H03F 2200/541; H03F 2203/7209

See application file for complete search history.

(56) References Cited

U.S. PATENT DOCUMENTS

| | | |
|---|---|---|
| 2014/0184356 A1 | 7/2014 | Kihara et al. |
| 2016/0373144 A1 | 12/2016 | Takenaka |
| 2016/0380652 A1 | 12/2016 | Anthony et al. |
| 2017/0026136 A1 | 1/2017 | Thompson et al. |
| 2021/0099199 A1* | 4/2021 | Pehlke ................. H04B 1/0475 |
| 2023/0071403 A1* | 3/2023 | Mansour ................. H04B 1/525 |
| 2024/0048163 A1* | 2/2024 | Tsuda ....................... H04B 1/00 |

FOREIGN PATENT DOCUMENTS

| | | |
|---|---|---|
| JP | 2016-076752 A | 5/2016 |
| JP | 2017-005641 A | 1/2017 |
| JP | 2017-017691 A | 1/2017 |
| JP | 2017-028699 A | 2/2017 |

* cited by examiner

HIGH-FREQUENCY CIRCUIT AND COMMUNICATION DEVICE

CROSS REFERENCE TO RELATED APPLICATION

This is a continuation of International Application No. PCT/JP2021/032658 filed on Sep. 6, 2021 which claims priority from Japanese Patent Application No. 2020-161139 filed on Sep. 25, 2020. The contents of these applications are incorporated herein by reference in their entireties.

BACKGROUND ART

Technical Field

The present disclosure relates to a high-frequency circuit and a communication device.

With the progress of multiband technology, mobile communication equipment such as mobile phones have been required to have a front end circuit that is capable of simultaneously transmitting high-frequency signals having mutually-different frequencies. For example, Patent Document 1 discloses a circuit configuration of an electronic system (high-frequency front end module) including a first transmission circuit and a second transmission circuit.

Patent Document 1: Japanese Unexamined Patent Application Publication No. 2017-17691

BRIEF SUMMARY

In the above-mentioned related art, however, when a plurality of high-frequency signals are simultaneously transmitted and simultaneously transmitted and received, intermodulation distortion (IMD) among the plurality of high-frequency signals overlaps with a reception band and receiving sensitivity sometimes degrades disadvantageously.

Therefore, the present disclosure provides a high-frequency circuit and a communication device that are capable of suppressing degradation of receiving sensitivity caused by intermodulation distortion in simultaneous transmission and simultaneous transmission and reception of a plurality of high-frequency signals.

A high-frequency circuit of an aspect of the present disclosure includes: a first filter that has a pass band including a transmission band of a first communication band; a second filter that has a pass band including a transmission band of a second communication band which is different from the first communication band; a third filter that has a pass band including a reception band of a third communication band; a first power amplifier that is connected with the first filter; and a second power amplifier that is connected with the second filter. Transmission in the first communication band, transmission in the second communication band, and reception in the third communication band can be simultaneously used. At least part of a frequency range of intermodulation distortion, which is generated between a second harmonic wave of a transmission signal of the first communication band and a fundamental wave of a transmission signal of the second communication band, overlaps with at least part of the reception band of the third communication band. The first power amplifier includes a first amplifying element, a second amplifying element, and an output converter that is a first transformer including a first coil and a second coil. One end of the first coil is connected with an output of the first amplifying element, the other end of the first coil is connected with an output of the second amplifying element, and one end of the second coil is connected with an output terminal of the first power amplifier.

According to the high-frequency circuit of the aspect of the present disclosure, degradation of receiving sensitivity caused by intermodulation distortion can be suppressed when a plurality of high-frequency signals are simultaneously transmitted and simultaneously transmitted and received.

DETAILED DESCRIPTION

Figure 1:
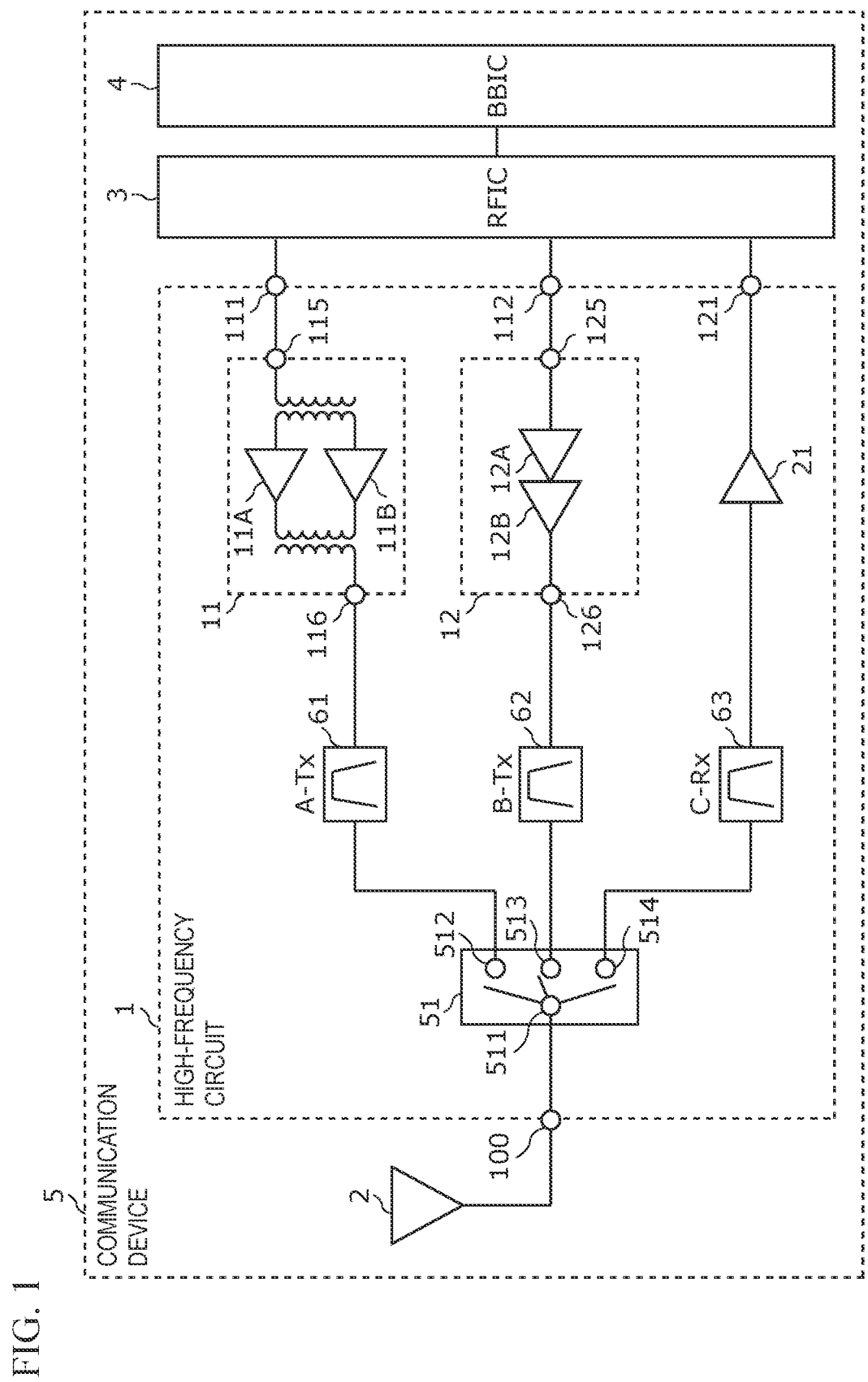
FIG. 1 is a circuit configuration diagram of a high-frequency circuit and a communication device according to an embodiment.

Embodiments according to the present disclosure will be described in detail below with reference to the accompanying drawings. All of the embodiments described below are generic or specific examples. Numerical values, shapes, materials, components, arrangement and connection forms of the components, and the like shown in the following embodiments are examples, and are not intended to limit the present disclosure.

Each drawing is a schematic diagram with emphasis, omission, or proportion adjustment performed as appropriate to illustrate the present disclosure. Thus, each drawing is not necessarily a strict illustration and may differ from the actual shapes, positioning, and proportions. In each drawing, the same reference characters are applied to substantially identical configurations and redundant description may be omitted or simplified.

In the circuit configuration of the present disclosure, "connected" includes not only direct connection by connection terminals and/or wiring conductors, but also electrical connection via other circuit elements. "Connected between A and B" means being connected with both of A and B between A and B.

EMBODIMENT

1.1 Circuit Configurations of High-Frequency Circuit 1 and Communication Device 5

Circuit configurations of a high-frequency circuit 1 and a communication device 5 according to the present embodiment will be described with reference to FIG. 1. FIG. 1 is a circuit configuration diagram of the high-frequency circuit 1 and the communication device 5 according to the embodiment.

1.1.1 Circuit Configuration of Communication Device 5

The circuit configuration of the communication device 5 will be first described. As illustrated in FIG. 1, the communication device 5 according to the present embodiment includes the high-frequency circuit 1, an antenna 2, an RFIC 3, and a BBIC 4.

The high-frequency circuit 1 transmits a high-frequency signal between the antenna 2 and the RFIC 3. The circuit configuration of the high-frequency circuit 1 will be described later.

The antenna 2 is connected with an antenna connection terminal 100 of the high-frequency circuit 1. The antenna 2 receives a high-frequency signal from the outside and outputs the high-frequency signal to the high-frequency circuit 1.

The RFIC 3 is an example of a signal processing circuit that processes a high-frequency signal. Specifically, the RFIC 3 processes a high-frequency reception signal, inputted via a reception path of the high-frequency circuit 1, by down-conversion or the like and outputs the reception signal generated by this signal processing to the BBIC 4. Further, the RFIC 3 includes a control unit that controls switches, amplifiers, and the like included in the high-frequency circuit 1. Here, part or all of the function as the control unit of the RFIC 3 may be mounted on the outside of the RFIC 3, and may be mounted, for example, on the BBIC 4 or the high-frequency circuit 1.

The BBIC 4 is a baseband signal processing circuit that processes a signal by using an intermediate frequency band which is lower in frequency than the high-frequency signal transmitted by the high-frequency circuit 1. Examples of a signal processed in the BBIC 4 include an image signal for displaying an image and/or an audio signal for calls through speakers.

In the communication device 5 according to the present embodiment, the antenna 2 and the BBIC 4 are optional components.

1.1.2 Circuit Configuration of High-frequency Circuit 1

The circuit configuration of the high-frequency circuit 1 will now be described. As illustrated in FIG. 1, the high-frequency circuit 1 includes power amplifiers 11 and 12, a low noise amplifier 21, a switch 51, filters 61 to 63, the antenna connection terminal 100, high-frequency input terminals 111 and 112, and a high-frequency output terminal 121.

The antenna connection terminal 100 is connected to the antenna 2.

Each of the high-frequency input terminals 111 and 112 is a terminal for receiving a high-frequency transmission signal from the outside of the high-frequency circuit 1. The high-frequency input terminal 111 can receive a transmission signal of a communication band A from the RFIC 3. The high-frequency input terminal 112 can receive a transmission signal of a communication band B from the RFIC 3. In the present embodiment, both of transmission signals received at the high-frequency input terminals 111 and 112 are unbalanced signals.

The high-frequency output terminal 121 is a terminal for providing a high-frequency reception signal to the outside of the high-frequency circuit 1. Specifically, the high-frequency output terminal 121 is a terminal for providing a reception signal of a communication band C to the RFIC 3.

The communication band means a frequency band predefined by a standards body (for example, 3rd Generation Partnership Project (3GPP) and Institute of Electrical and Electronics Engineers (IEEE)) or the like for communication systems.

Here, the communication systems mean communication systems built by using the radio access technology (RAT). Examples of the communication systems include 5th generation new radio (5GNR) systems, long term evolution (LTE) systems, and wireless local area network (WLAN) systems, but the communication systems are not limited to these.

The communication band A is an example of a first communication band. The communication band B is an example of a second communication band and is a different frequency band from the communication band A. The communication band C is an example of a third communication band. The communication band C may be the same as either one of the communication bands A and B or may be different from the communication bands A and B. The communication bands A, B, and C may be either a frequency division duplex (FDD) communication band or a time division duplex (TDD) communication band.

Here, transmission in the communication band A, transmission in the communication band B, and reception in the communication band C can be simultaneously used. "Transmission in the communication band A, transmission in the communication band B, and reception in the communication band C can be simultaneously used" means that a transmission signal of the communication band A, a transmission signal of the communication band B, and a reception signal of the communication band C are allowed to be simultaneously transmitted and received. However, it is not excluded that transmission and reception of a plurality of communication bands are each used independently. A combination of communication bands that can be simultaneously used is predefined by, for example, a standards body.

The power amplifier 11 is an example of a first power amplifier. An input terminal 115 of the power amplifier 11 is connected with the high-frequency input terminal 111 and an output terminal 116 of the power amplifier 11 is connected with the filter 61. The power amplifier 11 is capable of amplifying a transmission signal of the communication band A received at the high-frequency input terminal 111. At this time, the power amplifier 11 is capable of converting an unbalanced signal received at the high-frequency input terminal 111 into a balanced signal and amplifying the balanced signal. This kind of power amplifier 11 is sometimes called a differential amplifier. The detailed configuration of the power amplifier 11 will be described later with reference to FIG. 2.

A balanced signal means a pair of signals that have mutually-opposite phases. A balanced signal is sometimes called a differential signal. On the other hand, an unbalanced signal means a signal expressed by a potential difference from ground. An unbalanced signal is sometimes called a single end signal.

The power amplifier 12 is an example of a second power amplifier. An input terminal 125 of the power amplifier 12 is connected with the high-frequency input terminal 112 and an output terminal 126 of the power amplifier 12 is connected with the filter 62. The power amplifier 12 is a multi-stage amplifier and includes two amplifying elements 12A and 12B which are connected in series. The amplifying element 12A is equivalent to an input stage of a multi-stage amplifier. The amplifying element 12B is equivalent to an output stage of a multi-stage amplifier.

The power amplifier 12 is capable of amplifying a transmission signal of the communication band B received at the high-frequency input terminal 112. At this time, the power amplifier 12 is capable of amplifying the transmission signal of the communication band B as an unbalanced signal without necessarily conversion. That is, the power amplifier 12 is capable of amplifying an unbalanced signal of the communication band B received at the high-frequency input terminal 111 without necessarily converting the unbalanced signal into a balanced signal. This kind of power amplifier 12 is sometimes called a non-differential amplifier.

The configuration of the power amplifier 12 is not limited to the configuration of FIG. 1. For example, the power amplifier 12 may be a single-stage amplifier. Alternatively, the power amplifier 12 may be a differential amplifier or a Doherty amplifier.

The power amplifiers 11 and 12 correspond to a high-power class and a non-high-power class respectively. A power class is a classification of terminal output power which is defined as maximum output power or the like, and a smaller power class value indicates that it corresponds to higher power output. The maximum output power of a high-power class is larger than the maximum output power of a non-high-power class. The maximum output power is defined by output power at an antenna end of a terminal. The maximum output power is measured by a method defined by, for example, 3GPP. For example, the maximum output power is measured by measuring radiation power of the antenna 2, in FIG. 1. Instead of measuring radiation power, output power of the antenna 2 can be measured by providing a terminal near the antenna 2 and connecting a measuring instrument (such as a spectrum analyzer) to the terminal.

The high-power class is an example of a first power class and is expressed by a numerical value which is lower than a predetermined value. The non-high-power class is an example of a second power class and is expressed by a numerical value which is a predetermined value or greater. The predetermined value can be, for example, 3. In this case, the high-power class includes power classes 1, 1.5, and 2, and the non-high-power class includes power classes 3 and 4.

An input of the low noise amplifier 21 is connected with the filter 63 and an output of the low noise amplifier 21 is connected with the high-frequency output terminal 121. The low noise amplifier 21 is capable of amplifying a reception signal of the communication band C received at the antenna connection terminal 100. The reception signal of the communication band C amplified by the low noise amplifier 21 is outputted to the high-frequency output terminal 121.

Amplifying elements included in the power amplifiers 11 and 12 and low noise amplifier 21 can be composed of, for example, a field effect transistor (FET) or a hetero bipolar transistor (HBT) that is made of Si-based complementary metal oxide semiconductor (CMOS) or GaAs.

The switch 51 is connected between the antenna connection terminal 100 and the filters 61 to 63. The switch 51 includes terminals 511 to 514. The terminal 511 is connected with the antenna connection terminal 100. The terminals 512 to 514 are connected with the filters 61 to 63 respectively.

In this connection configuration, the switch 51 is capable of connecting at least one of the terminals 512 to 514 to the terminal 511 in response to, for example, a control signal from the RFIC 3. That is, the switch 51 is capable of switching connection and disconnection between the antenna connection terminal 100 and each of the filters 61 to 63. The switch 51 is composed of, for example, a multi-connection switching circuit and is called an antenna switch.

The filter 61 (A-Tx) is an example of a first filter and has a pass band including the transmission band of the communication band A. One end of the filter 61 is connected with the antenna connection terminal 100 via the switch 51. The other end of the filter 61 is connected with the output terminal 116 of the power amplifier 11.

The filter 62 (B-Tx) is an example of a second filter and has a pass band including the transmission band of the communication band B. One end of the filter 62 is connected with the antenna connection terminal 100 via the switch 51. The other end of the filter 62 is connected with the output terminal 126 of the power amplifier 12.

The filter 63 (C-Rx) is an example of a third filter and has a pass band including the reception band of the communication band C. One end of the filter 63 is connected with the antenna connection terminal 100 via the switch 51. The other end of the filter 63 is connected with the input of the low noise amplifier 21.

A transmission band is a frequency band for transmission in a communication band. As to a communication band for FDD, its transmission band is equivalent to an uplink operating band which is a portion in the communication band designated for uplink. As to a communication band for TDD, its transmission band is equivalent to the entire communication band.

A reception band is a frequency band for reception in a communication band. As to a communication band for FDD, its reception band is equivalent to a downlink operating band which is a portion in the communication band designated for downlink. As to a communication band for TDD, its reception band is equivalent to the entire communication band.

These filters 61 to 63 may be any of an acoustic wave filter using a surface acoustic wave (SAW), an acoustic wave filter using a bulk acoustic wave (BAW), an LC resonance filter, and a dielectric filter, for example, and further, the filters 61 to 63 are not limited to these.

Some of the circuit elements illustrated in FIG. 1 do not have to be included in the high-frequency circuit 1. For example, the high-frequency circuit 1 just has to include at least the power amplifiers 11 and 12 and the filters 61 to 63, and does not have to include other circuit elements (such as the switch 51 and the low noise amplifier 21).

1.1.3 Circuit Configuration of Power Amplifier 11

Figure 2:
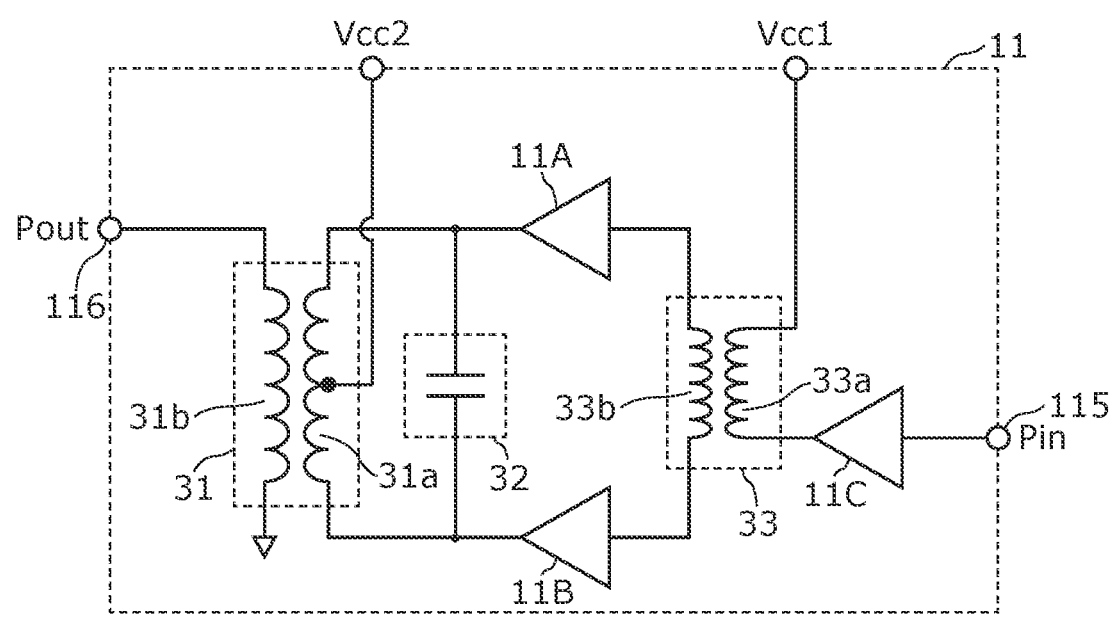
FIG. 2 is a circuit configuration diagram of a power amplifier included in the high-frequency circuit according to the embodiment.

An example of the circuit configuration of the power amplifier 11 will now be described with reference to FIG. 2. FIG. 2 is a circuit configuration diagram of the power amplifier 11 included in the high-frequency circuit 1 according to the embodiment. Hereinafter, a transformer is abbreviated as a trans.

As illustrated in FIG. 2, the power amplifier 11 includes the input terminal 115, the output terminal 116, amplifying elements 11A to 11C, an output trans 31, a capacitor 32, and an input trans 33.

The input terminal 115 is connected with the high-frequency input terminal 111 of the high-frequency circuit 1. An unbalanced signal received at the high-frequency input terminal 111 from the outside is transmitted to the input terminal 115.

The amplifying element 11C is equivalent to an input stage of a multi-stage amplifier. An input of the amplifying element 11C is connected with the input terminal 115 of the power amplifier 11, and an output of the amplifying element 11C is connected with the input trans 33. In this connection configuration, the amplifying element 11C is capable of amplifying an unbalanced signal received at the input terminal 115 in a state that a power supply voltage Vcc1 is applied.

The input trans 33 is an example of an input converter. The input trans 33 includes a coil 33a on the primary side and a coil 33b on the secondary side. The coil 33a is an example of a third coil. One end of the coil 33a is connected with an output terminal of the amplifying element 11C, and the power supply voltage Vcc1 is applied to the other end.

The coil 33b is an example of a fourth coil. One end of the coil 33b is connected with an input of the amplifying element 11A, and the other end is connected with an input of the amplifying element 11B.

The input trans 33 is capable of converting an unbalanced signal amplified in the amplifying element 11C into a balanced signal. That is, the input trans 33 is an unbalance-balance converter. Specifically, the input trans 33 is capable of converting a transmission signal of the communication band A amplified in the amplifying element 11C into an inverted signal whose phase is inverted and a non-inverted signal whose phase is not inverted.

The amplifying elements 11A and 11B are examples of a first amplifying element and a second amplifying element respectively and are capable of individually amplifying balanced signals outputted from the input trans 33. The input of the amplifying element 11A is connected with one end of the coil 33b of the input trans 33, and an output of the amplifying element 11A is connected with one end of a coil 31a of the output trans 31 and one end of the capacitor 32. The input of the amplifying element 11B is connected with the other end of the coil 33b of the input trans 33, and an output of the amplifying element 11B is connected with the other end of the coil 31a of the output trans 31 and the other end of the capacitor 32.

The output trans 31 is an example of an output converter. The output trans 31 includes the coil 31a on the primary side and a coil 31b on the secondary side. The coil 31a is an example of a first coil. One end of the coil 31a is connected with the output of the amplifying element 11A, and the other end is connected with the output of the amplifying element 11B. Further, a power supply voltage Vcc2 is applied to a midpoint of the coil 31a. The coil 31b is an example of a second coil. One end of the coil 31b is connected with the output terminal 116, and the other end is connected to the ground. That is, the output trans 31 is connected between the output of the amplifying element 11A and the output terminal 116 and between the output of the amplifying element 11B and the output terminal 116.

The output trans 31 is capable of converting a balanced signal into an unbalanced signal by combining balanced signals amplified in the amplifying elements 11A and 11B. That is, the output trans 31 is a balance-unbalance converter. Specifically, the output trans 31 is capable of combining an inverted signal and a non-inverted signal of a transmission signal of the communication band A.

The capacitor 32 is connected between the output of the amplifying element 11A and the output of the amplifying element 11B. Specifically, one end of the capacitor 32 is connected with the output of the amplifying element 11A and one end of the coil 31a. Further, the other end of the capacitor 32 is connected with the output of the amplifying element 11B and the other end of the coil 31a.

According to the circuit configuration of the power amplifier 11, the amplifying elements 11A and 11B operate in inverted phases. At this time, current in a fundamental wave of the amplifying element 11A and current in a fundamental wave of the amplifying element 11B flow in inverted phases, that is, flow in opposite directions. Therefore, it becomes hard for current in the fundamental wave to flow toward ground wiring and power supply wiring which are arranged at substantially the same distance from the amplifying elements 11A and 11B. This can suppress unwanted current flow into the ground wiring and the power supply wiring, being able to suppress reduction of power gain which have been found in conventional power amplifiers. Also, a non-inverted signal and an inverted signal that are amplified in the amplifying elements 11A and 11B respectively are combined. Therefore, noise components that are similarly superimposed on both of the signals can be canceled and even-order harmonic wave components can be reduced.

The circuit configuration of the power amplifier 11 in FIG. 2 is an example and is not limited to this. For example, the power amplifier 11 does not have to include the amplifying element 11C and the capacitor 32. Further, when a balanced signal is inputted into the power amplifier 11, the power amplifier 11 does not have to include the input trans 33.

In addition, a trans is used for unbalance-balance conversion and balance-unbalance conversion in the present embodiment, but the present disclosure is not limited to this. Namely, an input converter and an output converter are not limited to the input trans 33 and the output trans 31. For example, delay lines can be used as an input converter and an output converter.

1.2 Signal Flow in High-frequency Circuit 1

Figure 3:
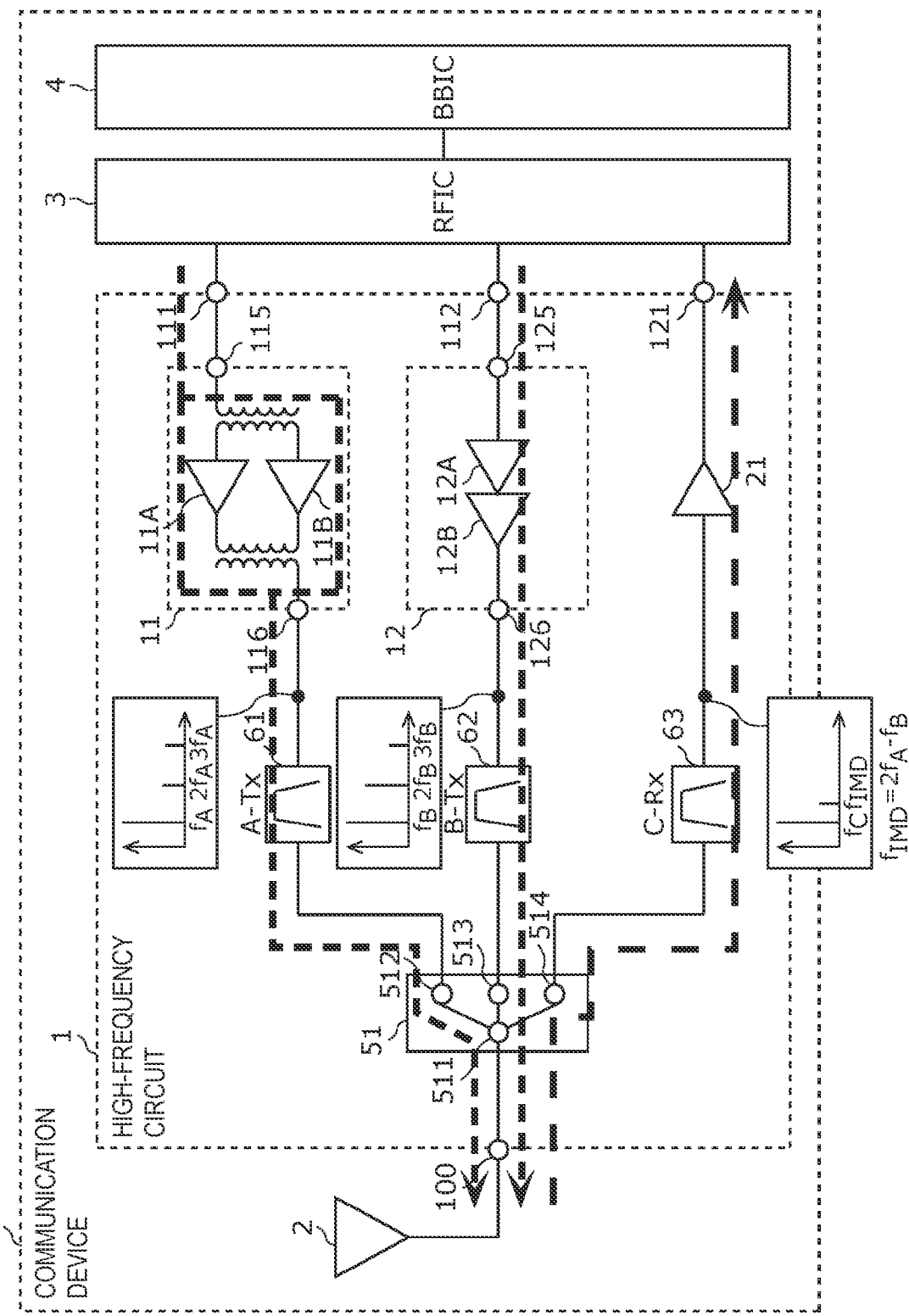
FIG. 3 is a diagram illustrating signal flow in the communication device according to the embodiment.

Simultaneous use of transmission in the communication band A, transmission in the communication band B, and reception in the communication band C in the communication device 5 will now be described. FIG. 3 is a diagram illustrating signal flow in the communication device 5 according to the embodiment. Dashed arrows in FIG. 3 indicate signal flow.

In FIG. 3, transmission in the communication band A, transmission in the communication band B, and reception in the communication band C are simultaneously used. That is, FIG. 3 illustrates a state of carrying out simultaneous transmission of a transmission signal of the communication band A, a transmission signal of the communication band B, and a reception signal of the communication band C.

In this example, all of the terminals 512 to 514 of the switch 51 are connected with the terminal 511. Accordingly, a transmission signal of the communication band A is transmitted from the RFIC 3 through the high-frequency input terminal 111, power amplifier 11, filter 61, switch 51, and antenna connection terminal 100 in this order to the antenna 2. Further, a transmission signal of the communication band B is transmitted from the RFIC 3 through the high-frequency input terminal 112, power amplifier 12, filter 62, switch 51, and antenna connection terminal 100 in this order to the antenna 2. Further, a reception signal of the communication band C is transmitted from the antenna 2 through the antenna connection terminal 100, switch 51, filter 63, low noise amplifier 21, and high-frequency output terminal 121 in this order to the RFIC 3.

At this time, in the switch 51 and/or the filters 61 to 63, for example, IMD is generated between a second harmonic wave of the transmission signal of the communication band A and a fundamental wave of the transmission signal of the communication band B. A frequency fIMD of IMD is expressed as the following by using a frequency fA of a fundamental wave of the transmission signal of the communication band A and a frequency fB of the fundamental wave of the transmission signal of the communication band B.

$$fIMD = 2fA - fB$$

As the frequency fA, an arbitrary frequency within the transmission band of the communication band A can be used. In a similar manner, as the frequency fB, an arbitrary frequency within the transmission band of the communication band B can be used. Thus, the frequency fIMD of IMD also varies within a frequency range defined depending on the transmission bands of the communication bands A and B.

If the frequency fIMD of IMD is included in the reception band of the communication band C, an unwanted wave of the IMD interferes a reception signal of the communication band C and reception sensitivity is accordingly degraded. In such circumstances, the high-frequency circuit 1 according to the present embodiment includes a differential amplifier as the power amplifier 11 for amplifying a transmission signal of the communication band A. This can suppress generation of a second harmonic wave of a transmission signal of the communication band A and reduce an unwanted wave of the IMD.

1.3 Specific Examples of Communication Bands A, B, and C

Specific examples of the communication bands A, B, and C will now be described. In the present embodiment, the communication bands A, B, and C satisfy the following conditions (1) and (2). (1) Transmission in the communication band A, transmission in the communication band B, and reception in the communication band C can be simultaneously used. (2) At least part of a frequency range of IMD, which is generated between a second harmonic wave of a transmission signal of the communication band A and a fundamental wave of a transmission signal of the communication band B, overlaps with at least part of the reception band of the communication band C.

Combinations shown in Table 1 are the conceivable specific examples of the communication bands A to C satisfying the conditions (1) and (2).

TABLE 1

| Communication band A (transmission band) | Communication band B (transmission band) | Communication band C (reception band) |
| --- | --- | --- |
| Band 1 | Band 3 | Band 1 |
| Band 3 | Band 1 | Band 32 |
| Band 40 | Band 1 | Band 41 |
| Band 40 | Band 1 | Band 7 |
| Band 1 | Band 7 | Band 32 |
| Band 1 | Band 40 | Band 7 |
| Band 1 | Band 40 | Band 41 |

The combinations of communication bands shown in Table 1 be examples and the communication bands A to C be not limited to the above.

1.4 Effects Etc.

As described above, the high-frequency circuit 1 according to the present embodiment includes: the filter 61 that has a pass band including the transmission band of the communication band A; the filter 62 that has a pass band including the transmission band of the communication band B which is different from the communication band A; the filter 63 that has a pass band including the reception band of the communication band C; the power amplifier 11 that is connected with the filter 61; and the power amplifier 12 that is connected with the filter 62. Transmission in the communication band A, transmission in the communication band B, and reception in the communication band C can be simultaneously used. At least part of a frequency range of intermodulation distortion, which is generated between a second harmonic wave of a transmission signal of the communication band A and a fundamental wave of a transmission signal of the communication band B, overlaps with at least part of the reception band of the communication band C. The power amplifier 11 includes the amplifying elements 11A and 11B and the output trans including the coils 31a and 31b. One end of the coil 31a is connected with the output of the amplifying element 11A, the other end of the coil 31a is connected with the output of the amplifying element 11B, and one end of the coil 31b is connected with the output terminal 116 of the power amplifier 11.

According to this configuration, the power amplifier 11 is capable of individually amplifying balanced signals by the amplifying elements 11A and 11B and combining the amplified balanced signals at the output trans 31 so as to generate an unbalanced signal. Accordingly, second harmonic wave components contained in an unbalanced signal can be reduced and therefore, intermodulation distortion, which is generated between a second harmonic wave of a transmission signal of the communication band A and a fundamental wave of a transmission signal of the communication band B, can also be reduced. As a result, interference by an unwanted wave of the intermodulation distortion to a reception signal of the communication band C can be suppressed and degradation of reception sensitivity caused by the intermodulation distortion can be suppressed. Further, the output trans 31 is capable of performing impedance conversion in addition to balance-unbalance conversion and accordingly, impedance matching can be achieved between an output impedance of the power amplifier 11 and an input impedance of the filter 61.

Further, for example, in the high-frequency circuit 1 according to the present embodiment, the power amplifier 11 may correspond to a high-power class, the power amplifier 12 may correspond to a non-high-power class, and the maximum output power of the high-power class may be larger than the maximum output power of the non-high-power class.

According to this configuration, generation of a second harmonic wave can be suppressed in the power amplifier 11 which is required to have greater output power. Thus, a second harmonic wave of a transmission signal of the communication band A can be effectively reduced and intermodulation distortion, which is generated between a second harmonic wave of a transmission signal of the communication band A and a fundamental wave of a transmission signal of the communication band B, can also be more effectively reduced.

Further, for example, in the high-frequency circuit 1 according to the present embodiment, the amplifying elements 11A and 11B may be capable of individually amplifying a balanced signal that is a transmission signal of the communication band A, and by combining the balanced signal amplified in the amplifying element 11A and the balanced signal amplified in the amplifying element 11B with each other, the output trans 31 may be capable of converting the balanced signals into an unbalanced signal.

According to this configuration, balanced signals can be individually amplified and the amplified balanced signals can be combined to generate an unbalanced signal.

Further, for example, in the high-frequency circuit 1 according to the present embodiment, the power amplifier 12 may be capable of amplifying a transmission signal of the communication band B as an unbalanced signal without necessarily conversion.

According to this configuration, a so-called non-differential amplifier can be used as the power amplifier 12. In a non-differential amplifier, the number of amplifying elements can be reduced and elements for balance-unbalance conversion and the like can be omitted. Accordingly, the power amplifier 12 can be downsized compared to a differential amplifier, being able to contribute to downsizing of the high-frequency circuit 1. Further, in the present embodiment, a second harmonic wave generated in the power amplifier 12 has little effect on intermodulation distortion included in the reception band of the communication band C described above. Accordingly, even when a differential amplifier is not used as the power amplifier 12, degradation of reception sensitivity caused by intermodulation distortion can be suppressed with the use of a differential amplifier as the power amplifier 11.

Further, for example, in the high-frequency circuit 1 according to the present embodiment, the power amplifier 11 may further include an input converter that is connected with the amplifying element 11A and the amplifying element 11B and is capable of converting a transmission signal of the first communication band from an unbalanced signal into the balanced signal.

According to this configuration, the power amplifier 11 is capable of converting an unbalanced signal into a balanced signal and therefore, the power amplifier 11 can receive a transmission signal of the communication band A from the RFIC 3 as the transmission signal is an unbalanced signal. Thus, a conventional high-frequency circuit can be replaced with the high-frequency circuit 1 according to the present embodiment.

Further, for example, in the high-frequency circuit 1 according to the present embodiment, the input converter may be the input trans 33 that includes the coil 33a and the coil 33b. One end of the coil 31a may be connected with the input terminal 115 of the power amplifier 11, one end of the coil 33b may be connected with the input of the amplifying element 11A, and the other end of the coil 33b may be connected with the input of the amplifying element 11B.

According to this configuration, a transformer can be used as an input converter. Thus, the input converter is capable of performing impedance conversion in addition to unbalance-balance conversion.

Further, for example, in the high-frequency circuit 1 according to the present embodiment, both of the communication band A and the communication band C may be a band 1 for LTE or 5GNR and the communication band B may be a band 3 for LTE or 5GNR. Further, for example, in the high-frequency circuit 1 according to the present embodiment, the communication band A may be the band 3 for LTE or 5GNR, the communication band B may be the band 1 for LTE or 5GNR, and the communication band C may be a band 32 for LTE or 5GNR. Further, for example, in the high-frequency circuit 1 according to the present embodiment, the communication band A may be a band 40 for LTE or 5GNR, the communication band B may be the band 1 for LTE or 5GNR, and the communication band C may be a band 41 for LTE or 5GNR. Further, for example, in the high-frequency circuit 1 according to the present embodiment, the communication band A may be the band 40 for LTE or 5GNR, the communication band B may be the band 1 for LTE or 5GNR, and the communication band C may be a band 7 for LTE or 5GNR. Further, for example, in the high-frequency circuit 1 according to the present embodiment, the communication band A may be the band 1 for LTE or 5GNR, the communication band B may be the band 7 for LTE or 5GNR, and the communication band C may be the band 32 for LTE or 5GNR.

The use of these communication bands as the communication bands A to C can effectively suppress degradation of reception sensitivity caused by intermodulation distortion.

Further, the communication device 5 according to the present embodiment includes the RFIC 3 that processes a high-frequency signal and the high-frequency circuit 1 that transmits the high-frequency signal between the RFIC 3 and the antenna 2.

Accordingly, the same effects as those of the high-frequency circuit 1 can be realized in the communication device 5.

Other Embodiments

The high-frequency circuit and communication device according to the present disclosure have been described above based on the embodiment. However, the high-frequency circuit and communication device according to the present disclosure are not limited to the above-described embodiment. The disclosure also includes modifications that can be obtained by making various changes, which a person skilled in the art can think of, to the above-described embodiment without necessarily departing from the scope of the present disclosure, and various devices incorporating the above-described high-frequency circuit and communication device.

For example, in the circuit configurations of the high-frequency circuit and communication device according to the above-described embodiment, another circuit element and wiring, for example, may be inserted between the paths connecting the circuit elements and signal paths disclosed in the drawings. For example, an impedance matching circuit may be inserted between the switch 51 and each of the filters 61 to 63. This impedance matching circuit can be composed, for example, of an inductor and/or a capacitor.

Further, for example, each of the power amplifiers 11 and 12 and low noise amplifier 21 may be shared by a plurality of communication bands, in the circuit configurations of the high-frequency circuit and communication device according to the above-described embodiment. For example, the power amplifier 11 may be connected with a plurality of filters via a switch.

Furthermore, for example, when the communication bands A and C are identical communication bands, the filters 61 and 63 may be configured as a duplexer, in the circuit configuration of the high-frequency circuit according to the above-described embodiment.

Also, for example, the communication device according to the above-described embodiment may include a plurality of antennas. In this configuration, the filters 61 to 63 may be individually connected with different filters. Alternatively, two of the filters 61 to 63 may be connected with one antenna and the remaining one of the filters 61 to 63 may be connected with another antenna.

INDUSTRIAL APPLICABILITY

The present disclosure is widely applicable to communication devices, such as mobile phones, as a high-frequency circuit arranged in a front end portion.

REFERENCE SIGNS LIST 1 high-frequency circuit
2 antenna
3 RFIC
4 BBIC
5 communication device
11, 12 power amplifier
11A, 11B, 11C, 12A, 12B amplifying element 21 low noise amplifier
31 output trans
31a, 31b, 33a, 33b coil
32 capacitor
33 input trans
51 switch
61, 62, 63 filter
100 antenna connection terminal
111, 112 high-frequency input terminal
115, 125 input terminal
116, 126 output terminal
121 high-frequency output terminal
511, 512, 513, 514 terminal

The invention claimed is:

1. A high-frequency circuit comprising:
a first filter that comprises a pass band including a transmission band of a first communication band;
a second filter that comprises a pass band including a transmission band of a second communication band which is different from the first communication band;
a third filter that comprises a pass band including a reception band of a third communication band;
a first power amplifier that is connected to the first filter; and
a second power amplifier that is connected to the second filter, wherein
transmission in the first communication band, transmission in the second communication band, and reception in the third communication band is simultaneously used,
at least part of a frequency range of intermodulation distortion overlaps with at least part of the reception band of the third communication band, the intermodulation distortion being generated between a second harmonic wave of a transmission signal of the first communication band and a fundamental wave of a transmission signal of the second communication band,
the first power amplifier includes
a first amplifying circuit element and a second amplifying circuit element, and
an output converter that comprises a first transformer including a first coil and a second coil,
a first end of the first coil is connected to an output of the first amplifying circuit element,
a second end of the first coil is connected to an output of the second amplifying circuit element, and
a first end of the second coil is connected to an output terminal of the first power amplifier.

2. The high-frequency circuit according to claim 1, wherein
the first power amplifier corresponds to a first power class,
the second power amplifier corresponds to a second power class, and
a maximum output power of the first power class is larger than a maximum output power of the second power class.

3. The high-frequency circuit according to claim 1, wherein
the first amplifying circuit element and the second amplifying circuit element are configured to individually amplify a balanced signal that is a transmission signal of the first communication band, and
by combining the balanced signal amplified in the first amplifying circuit element and the balanced signal amplified in the second amplifying circuit element with each other, the output converter is configured to convert the balanced signals into an unbalanced signal.

4. The high-frequency circuit according to claim 3, wherein
the second power amplifier is configured to amplify a transmission signal of the second communication band as an unbalanced signal without conversion.

5. The high-frequency circuit according to claim 3, wherein
the first power amplifier further includes an input converter that is connected to the first amplifying circuit element and the second amplifying circuit element, and is configured to convert a transmission signal of the first communication band from an unbalanced signal into the balanced signal.

6. The high-frequency circuit according to claim 5, wherein
the input converter comprises a second transformer that includes a third coil and a fourth coil,
a first end of the third coil is connected to an input terminal of the first power amplifier,
a first end of the fourth coil is connected to an input of the first amplifying circuit element, and
a second end of the fourth coil is connected to an input of the second amplifying circuit element.

7. The high-frequency circuit according to claim 1, wherein
both of the first communication band and the third communication band are a band 1 for Long Term Evolution (LTE) or 5th Generation New Radio (5GNR), and
the second communication band is a band 3 for LTE or 5GNR.

8. The high-frequency circuit according to claim 1, wherein
the first communication band is a band 3 for Long Term Evolution (LTE) or 5th Generation New Radio (5GNR),
the second communication band is a band 1 for Long Term Evolution (LTE) or 5th Generation New Radio (5GNR), and
the third communication band is a band 32 for LTE or 5GNR.

9. The high-frequency circuit according to claim 1, wherein
the first communication band is a band 40 for Long Term Evolution (LTE) or 5th Generation New Radio (5GNR),
the second communication band is a band 1 for LTE or 5GNR, and
the third communication band is a band 41 for LTE or 5GNR.

10. The high-frequency circuit according to claim 1, wherein
the first communication band is a band 40 for LTE or 5GNR,
the second communication band is a band 1 for LTE or 5GNR, and
the third communication band is a band 7 for LTE or 5GNR.

11. The high-frequency circuit according to claim 1, wherein
the first communication band is a band 1 for LTE or 5GNR, the second communication band is a band 7 for LTE or 5GNR, and the third communication band is a band 32 for LTE or 5GNR.

12. A communication device comprising:

a signal processing circuit that is configured to process a high-frequency signal; and the high-frequency circuit according to claim 1 that is configured to transmit the high-frequency signal between the signal processing circuit and an antenna.

13. The high-frequency circuit according to claim 2, wherein the first amplifying circuit element and the second amplifying circuit element are configured to individually amplify a balanced signal that is a transmission signal of the first communication band, and by combining the balanced signal amplified in the first amplifying circuit element and the balanced signal amplified in the second amplifying circuit element with each other, the output converter is configured to convert the balanced signals into an unbalanced signal.

14. The high-frequency circuit according to claim 13, wherein the second power amplifier is configured to amplify a transmission signal of the second communication band as an unbalanced signal without conversion.

15. The high-frequency circuit according to claim 4, wherein the first power amplifier further includes an input converter that is connected to the first amplifying circuit element and the second amplifying circuit element, and is configured to convert a transmission signal of the first communication band from an unbalanced signal into the balanced signal.

16. The high-frequency circuit according to claim 2, wherein both of the first communication band and the third communication band are a band 1 for Long Term Evolution (LTE) or 5th Generation New Radio (5GNR), and the second communication band is a band 3 for LTE or 5GNR.

17. The high-frequency circuit according to claim 3, wherein both of the first communication band and the third communication band are a band 1 for Long Term Evolution (LTE) or 5th Generation New Radio (5GNR), and the second communication band is a band 3 for LTE or 5GNR.

18. The high-frequency circuit according to claim 4, wherein both of the first communication band and the third communication band are a band 1 for Long Term Evolution (LTE) or 5th Generation New Radio (5GNR), and the second communication band is a band 3 for LTE or 5GNR.

19. The high-frequency circuit according to claim 5, wherein both of the first communication band and the third communication band are a band 1 for Long Term Evolution (LTE) or 5th Generation New Radio (5GNR), and the second communication band is a band 3 for LTE or 5GNR.

20. The high-frequency circuit according to claim 6, wherein both of the first communication band and the third communication band are a band 1 for Long Term Evolution (LTE) or 5th Generation New Radio (5GNR), and the second communication band is a band 3 for LTE or 5GNR.

\* \* \* \* \*